United States Patent
Koh

(10) Patent No.: US 7,176,517 B2
(45) Date of Patent: Feb. 13, 2007

(54) FLASH MEMORIES AND METHODS OF FABRICATING THE SAME

(75) Inventor: Kwan-Ju Koh, Bucheon (KR)

(73) Assignee: Dongbu Electronics Co., Ltd., Seoul (KR)

( * ) Notice: Subject to any disclaimer, the term of this patent is extended or adjusted under 35 U.S.C. 154(b) by 0 days.

(21) Appl. No.: 10/915,892

(22) Filed: Aug. 11, 2004

(65) Prior Publication Data

US 2005/0037573 A1   Feb. 17, 2005

(30) Foreign Application Priority Data

Aug. 12, 2003   (KR)   ............... 10-2003-0055791

(51) Int. Cl.
*H01L 29/788* (2006.01)
(52) U.S. Cl. ............... 257/315; 257/316
(58) Field of Classification Search ........ 257/315–316, 257/318, 320
See application file for complete search history.

(56) References Cited

U.S. PATENT DOCUMENTS

| | | | |
|---|---|---|---|
| 5,950,087 A | 9/1999 | Hsieh et al. | 438/264 |
| 5,989,960 A * | 11/1999 | Fukase | 438/267 |
| 6,151,248 A | 11/2000 | Harari et al. | 365/185.14 |
| 6,204,126 B1 | 3/2001 | Hsieh et al. | 438/267 |
| 6,528,843 B1 | 3/2003 | Wu | 257/315 |
| 6,570,213 B1 | 5/2003 | Wu | 257/315 |

FOREIGN PATENT DOCUMENTS

KR   10-2002-0045434   6/2002

* cited by examiner

*Primary Examiner*—Phat X. Cao
(74) *Attorney, Agent, or Firm*—Andrew D. Fortney

(57) ABSTRACT

The present disclosure relates to a flash memory including a common source line having a predetermined width formed on a semiconductor substrate, a common source in the semiconductor substrate below the common source line, and a couple of floating gates having a predetermined width formed on both outer side walls of the common source line. The flash memory may also include a couple of tunneling oxide layers formed between the floating gate and the common source line, and between the floating gate and the semiconductor substrate, a couple of dielectric layers formed on each of the couple of floating gates, and a couple of control gates formed on each of the couple of dielectric layers. Further, the flash memory may include a couple of drains formed in the semiconductor substrate by injecting impurity ions in using the control gate and the common source line as a mask.

15 Claims, 3 Drawing Sheets

FLASH MEMORIES AND METHODS OF FABRICATING THE SAME

CROSS REFERENCE TO RELATED APPLICATIONS

This application claims priority to and the benefit of Korean Patent Application No. 2003-0055791, filed on Aug. 12, 2003 in the Korean Intellectual Property Office, the entire content of which is incorporated herein by reference.

TECHNICAL FIELD

The present disclosure relates to semiconductor memories, and in particular, to flash memories and methods of fabricating the same.

BACKGROUND

Generally, semiconductor memory devices are divided into a volatile memory devices and a non-volatile memory devices. Example volatile memory device include random access memory (RAM), dynamic RAM (DRAM), and static RAM (SRAM). Volatile memory devices are characterized in that data stored in volatile memory devices is erased when power is removed from the volatile memory device.

As opposed to volatile memory devices, non-volatile memory devices, such as read only memory (ROM) retain their contents when power is removed from the non-volatile memory devices.

Currently, non-volatile memory devices are divided into floating gate based memory and metal insulator semiconductor (MIS) based memory. Floating gate based memory devices operate using a potential well. Typical floating gate based memory devices include an erasable programmable read only memory (EPROM) tunnel oxide (ETOX) structure that is applied as a flash electrically erasable programmable read only memory (EEPROM).

MIS based memory is characterized in that such devices include two or more kinds of dielectric layers that are stacked to form a double layer or a triple layer device. MIS based memory devices utilize a trap that exists in an interface between the dielectric bulk and the dielectric layer, and between the dielectric layer and the semiconductor. Example MIS based memory devices include metal oxide-nitride-oxide semiconductor (MONOS) and silicon oxide-nitride-oxide semiconductor (SONOS) structures that are applied as electrically erasable programmable read only memory (EEPROM).

A conventional flash memory having the oxide-nitride-oxide (ONO) structure is illustrated in FIG. 1. As shown in FIG. 1, a tunneling oxide layer 2 having a predetermined width and a thickness of about 100 Å is formed on a semiconductor substrate 1. A floating gate 3 formed of polycrystalline silicon and having a thickness of about 2500 Å is formed thereon. A dielectric layer 4 of an ONO structure is formed on the floating gate 3.

A control gate 5 formed of polycrystalline silicon and having a thickness of about 2500 Å is formed on the dielectric layer 4. A side wall 6 is formed on both side wall of the control gate 5, the dielectric layer 4, the floating gate 3, and the tunneling oxide layer 2.

A source 7 and a drain 8 are formed in the semiconductor substrate 1 located outside of the control gate 5, the dielectric layer 4, the floating gate 3 and the tunneling oxide layer 2.

Technical development for reducing the size of the flash memory as described above is currently being undertaken, however, there is still a limitation on reducing the device size. For example, mass production of an ultra fine silicon device needing an ultra fine pattern cannot realized because there is no settled technique using a new process for forming patterns, such as an exposure method using an electron beam or an X-ray to fabricate a nano-sized channel of the device.

DETAILED DESCRIPTION

The flash memory and the method for fabricating the flash memory according to a preferred embodiment of the present invention will be described in detail.

Figure 1:
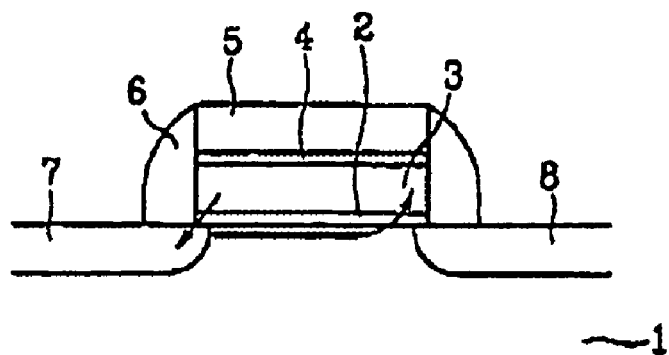
FIG. 1 is a cross sectional view illustrating a conventional flash memory.
Figure 2A:
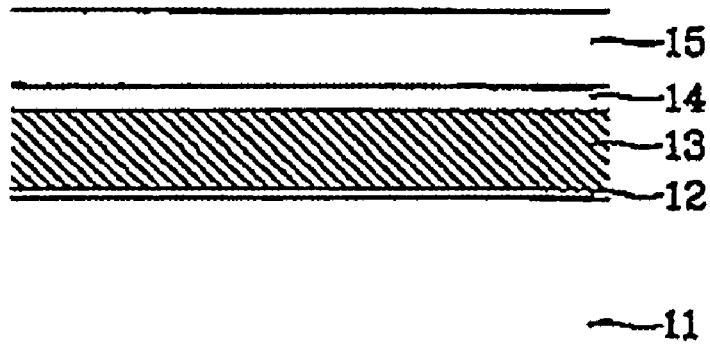
FIGS. 2A to 2F show cross sectional views illustrating various stages of fabrication of a flash memory according to the present disclosure.
Figure 2B:
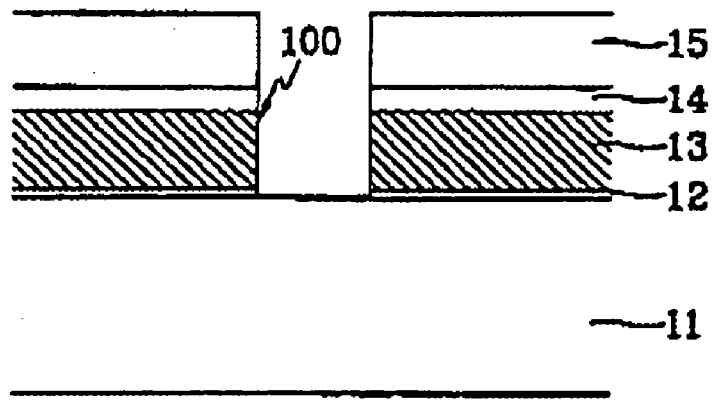
Figure 2C:
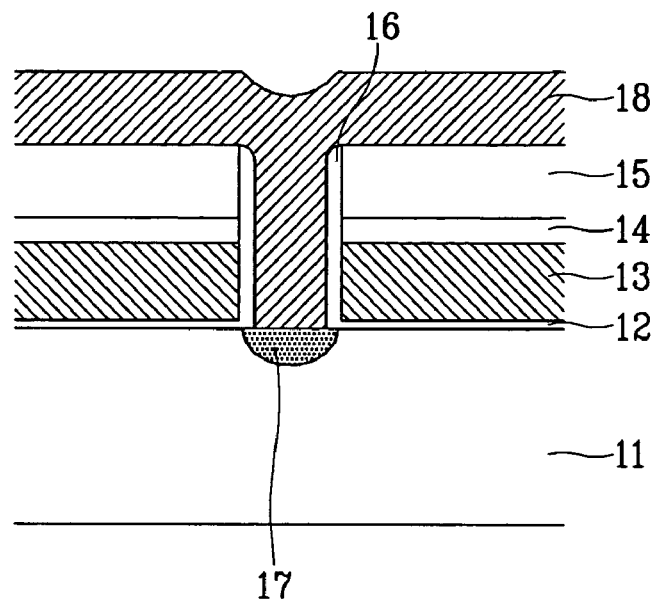
Figure 2D:
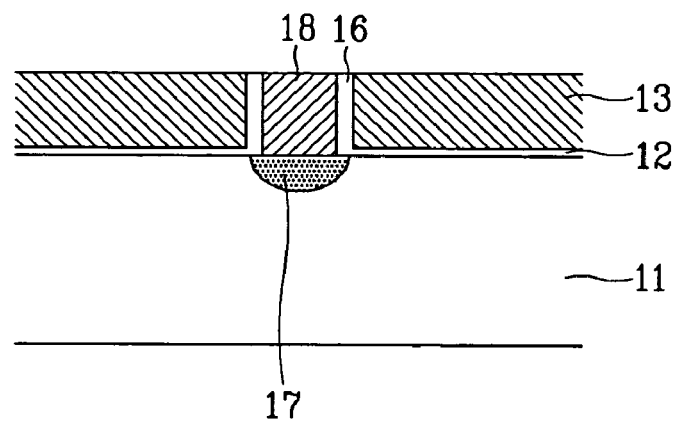
Figure 2E:
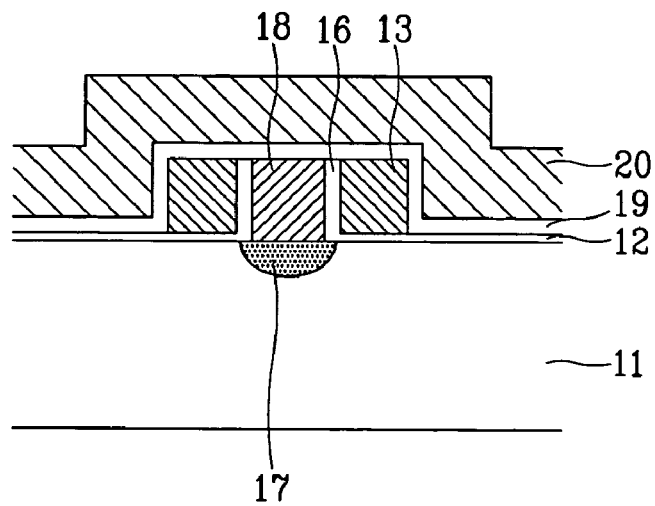
Figure 2F:
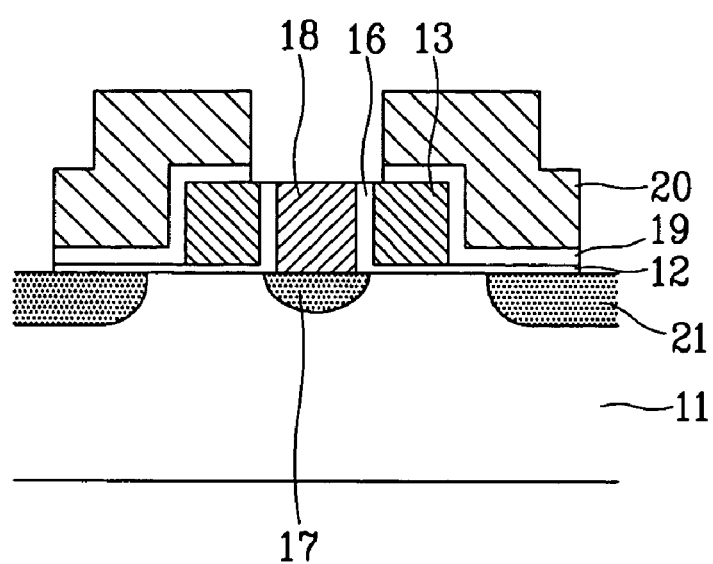

With reference to FIG. 2F, a common source line 18 having a predetermined width is formed on a semiconductor substrate 11. The common source line 18 may be, for example, formed of a conductive material, such as impurity-doped polycrystalline silicon. A common source 17 is formed in the semiconductor substrate below the common source line 18.

A number of floating gates 13 having a predetermined width are formed on both outer side walls of the common source line 18. According to one example there may be a couple of floating gates 13 forms proximate the common source line 18. A couple of tunneling oxide layers 12, 16 are formed between the floating gate 13 and the common source line 18, and between the floating gate 13 and the semiconductor substrate 11. According to one example, the tunneling oxide layer 12, 16 can be formed on the semiconductor substrate outside of the floating gate 13.

A couple of dielectric layers 19 are formed on each of the floating gates 13. The dielectric layer 19 can be formed on the tunneling oxide layer 12. A couple of control gates 20 are formed on each of the couple of the dielectric layer 19.

Further, a couple of drains 21 are formed in the semiconductor substrate 11 by injecting impurity ions therein using the control gate 20 and the common source line 18 as a mask.

As disclosed herein, floating gates 13, dielectric layers 19, control gates 20, and drains 21 are formed on each side of the common source line 18, thereby forming couples.

Hereafter, a contact for applying an electric signal is formed on each of the couple of the control gate 20. A metal line is connected through the contact.

In the flash memory as described above, when a proper voltage is applied to the control gate 20 for operating the device, carriers move from the common source 17 to each of the drains 21 to result in the flow of electricity.

The flow of electricity to each of the drains, that is, an electric signal in each of the drains, is independently controlled by controlling the applying voltage into the control gate 20. For example, it is possible to make an OFF signal in the right drain and to make an ON signal in the left drain.

The method for fabricating the flash memory as describe above is explained in detail as follows.

First, as shown in FIG. 2A, a first tunneling oxide layer 12, a floating gate 13, and sacrificial layers 14, 15 are sequentially formed on a semiconductor substrate 11.

According to one implementation, the floating gate 13 may be polycrystalline silicon, and the sacrificial layers may be nitride and oxide layers, respectively.

The sacrificial layers 14, 15 are selectively formed to protect the floating gate 13 in a process of injecting impurity ions for forming a common source. The nitride layer 14 of the sacrificial layer acts as an etch-stop layer in the process of chemical mechanical polishing as described below.

Next, as shown in FIG. 2B, portions of the sacrificial layers 14, 15, the floating gate 13, and the first tunneling oxide layer 12 are selectively etched to form a window 100 exposing the semiconductor substrate 11.

As shown in FIG. 2C, subsequently a second tunneling oxide layer 16 is formed on both inner side walls of the window 100 to connect the first tunneling oxide layer 12 with the second tunneling oxide layer 16. One example for forming the second tunneling oxide layer 16 is that the second tunneling oxide layer is deposited over the semiconductor substrate 11 including the window 100 and then etched by etch-back process.

Next, a process of injecting impurity ions is performed over the semiconductor substrate 11 to form a common source 17 in the semiconductor substrate 11 exposed through the window 100.

A conductive material for the common source line 18 is deposited over the semiconductor substrate 11 to fill into the window 100. As the conductive material for the common source line 18, impurity-doped polycrystalline silicon can be formed. The impurity-doped polycrystalline silicon can be formed by depositing polycrystalline silicon and then injecting impurity ions into the polycrystalline silicon, or can be formed by simultaneously performing the deposition of the polycrystalline silicon and the injection of the impurity ions.

Next, as shown in FIG. 2D, the conductive material for the common source line 18 and the sacrificial layer 14, 15 are removed by chemical mechanical polishing while using the nitride layer 14 as an etch-stop layer until the floating gate 13 is exposed. In result, the second tunneling oxide layer 16 remains having a predetermined height, and the common source line 18 is formed to be filled into the window 100 and to have the same height with the second tunneling oxide layer 16.

As shown in FIG. 2E, subsequently the floating gate 13 is selectively etched to be a couple of floating gates on both outer side walls of the common source line 18. Each of the couple of the floating gates 13 has a predetermined width.

Next, a dielectric layer 19 and a control gate 20 are sequentially formed over the semiconductor substrate 11.

According to one example, the dielectric layer 19 may be an ONO structure including a first oxide layer, a nitride layer, and a second oxide layer. The control gate 20 may be fabricated from polycrystalline silicon Next, as shown in FIG. 2F, the control gate 20, the dielectric layer 19, and the first tunneling oxide layer 12 are selectively etched to have a predetermined width covering portions of the semiconductor substrate 11 and to expose the common source line 18. Here, the dielectric layer 19 and the control gate 20 are formed to be step-shaped covering the floating gate 13 and portions of the semiconductor substrate 11 neighboring the floating gate 13.

Finally, a couple of drains 21 are formed by injecting impurity ions into the semiconductor substrate 11 in using the control gate 20 and the common source line 18 as a mask. As a result, the couple of drains 21 are formed in the semiconductor substrate 11 located outside of the control gate 20.

As described above, the disclosed techniques, devices, and processes are designed to provide a flash memory having a reduced size. Accordingly, the methods disclosed herein include sequentially forming a first tunneling oxide layer and a floating gate on a semiconductor substrate, etching portions of the floating gate and the first tunneling oxide layer to form a window exposing the semiconductor substrate, and forming a second tunneling oxide layer on both inner side walls of the window. The method may also include forming a common source in the semiconductor substrate being exposed through the window, forming a common source line by filling a conductive material into the window, and selectively etching the floating gate to leave a couple of the floating gates on both outer side walls of the common source line, the couple of floating gates having a predetermined width. Subsequently, the method may include sequentially forming a dielectric layer and a control gate over each of the floating gates and forming a couple of drains by injecting impurity ions into the semiconductor substrate while using the control gate and the common source line as a mask.

As disclosed herein, forming the common source line may include forming the conductive material over the semiconductor substrate to fill into the window; and removing the conductive material to expose the floating gate.

Additionally, methods for fabricating a flash memory may include forming a sacrificial layer on the floating gate and then performing the etching to form the window, wherein the sacrificial layer is removed in the forming the common source line. Further, forming the common source line may include forming the conductive material over the semiconductor substrate to fill into the window and removing the conductive material by chemical mechanical polishing until the floating gate is exposed.

In the foregoing examples, the sacrificial layer may include sequentially formed nitride and oxide layers. The nitride layer may be used as an etch-stop layer in the chemical mechanical polishing of the conductive material. The conductive material may be formed out of an impurity-doped polycrystalline silicon. The impurity-doped polycrystalline silicon may be formed by depositing a polycrystalline silicon and then injecting impurity ions into the polycrystalline silicon, or is formed by simultaneously performing the deposition of the polycrystalline silicon and the injection of the impurity ions.

The dielectric layer may include sequentially formed a first oxide layer, a nitride layer, and a second oxide layer.

The dielectric layer may be formed to cover the floating gate and the first tunneling oxide layer.

Forming the dielectric layer and the control gate may include forming the dielectric layer and the control gate over the semiconductor substrate and etching the dielectric layer and the control gate selectively to expose the common gate line and cover the floating gate and portions of the semiconductor substrate. The dielectric layer and the control gate over each of the floating gate may be formed to be step-shaped covering the floating gate and portions of the semiconductor substrate.

Further, the present disclosure describes a flash memory including a common source line having a predetermined width formed on a semiconductor substrate, a common source in the semiconductor substrate below the common source line, and a couple of floating gates having a predetermined width formed on both outer side walls of the common source line. The flash memory may further include a couple of tunneling oxide layers formed between the floating gate and the common source line, and between the floating gate and the semiconductor substrate, a couple of dielectric layers formed on each of the couple of floating gates, and a couple of control gates formed on each of the couple of dielectric layers. Additionally, the flash memory may include a couple of drains formed in the semiconductor substrate by injecting impurity ions in using the control gate and the common source line as a mask.

The tunneling oxide layer may be formed between the floating gate and the common source line, between the floating gate and the semiconductor substrate, and on the semiconductor substrate outside of the floating gate. The dielectric layer and the control gate may be formed to have a predetermined width. An electric signal in each of the drains may be independently controlled.

Although certain apparatus constructed in accordance with the teachings of the invention have been described herein, the scope of coverage of this patent is not limited thereto. On the contrary, this patent covers every apparatus, method and article of manufacture fairly falling within the scope of the appended claims either literally or under the doctrine of equivalents.

What is claimed is:

1. A flash memory comprising:
   a common source line having a first predetermined width, on a semiconductor substrate;
   a common source in the semiconductor substrate below the common source line;
   first and second floating gates having a second predetermined width and a height substantially equal to that of the common source line, on outer side walls of the common source line;
   first tunneling oxide layers between the first floating gate and the semiconductor substrate;
   a second tunneling oxide layer between to second floating gate and the semiconductor substrate;
   first and second dielectric layers, each comprising a first oxide layer, a nitride layer, and a second oxide layer, respectively on top and side surfaces of the first and second floating gates and over the semiconductor substrate outside the first and second floating gates;
   first and second control gates respectively on the first and second dielectric layers, including over the semiconductor substrate outside the first and second floating gates such that the first and second control gates each have a step; and
   first and second drains in the semiconductor substrate outside the control gate and the common source line.

2. The flash memory as defined by claim 1, wherein the common source line comprises impurity-doped polycrystalline silicon.

3. The flash memory as defined by claim 1, wherein the first tunneling oxide layer is further between the first floating gate and the common source line.

4. The flash memory as defined by claim 3, wherein the first dielectric layer covers the first floating gate and the first tunneling oxide layer.

5. The method as defined by claim 1, wherein the first and second control gates have a predetermined width.

6. The flash memory as defined by claim 1, wherein each of the first and second drains is independently controlled.

7. The flash memory as defined by claim 3, wherein the second tunneling oxide layer is further between the second floating gate and the common source line.

8. The flash memory as defined by claim 3, wherein the first tunneling oxide layer is further on the semiconductor substrate outside of the first floating gate.

9. The flash memory as defined by claim 7, wherein the second tunneling oxide layer is further on the semiconductor substrate outside of the floating gate.

10. The flash memory as defined by claim 4, wherein the second dielectric layer covers the second floating gate and the second tunneling oxide layer.

11. The flash memory as defined by claim 5, wherein the first and second dielectric layers have a predetermined width.

12. The flash memory as defined by claim 11, wherein the predetermined width of the first and second dielectric layers is substantially the same as the first and second control gates.

13. The flash memory as defined by claim 1, farther comprising a third tunneling oxide between the first floating gate and the common source line.

14. The flush memory as defined by claim 13, further comprising a fourth tunneling oxide between the second floating gate and the common source line.

15. The flash memory as defined by claim 1, wherein the first and second control gates have an inner sidewall over the first and second floating gates, respectively.

* * * * *